United States Patent
Schlenga et al.

(10) Patent No.: US 9,159,897 B2
(45) Date of Patent: Oct. 13, 2015

(54) SUPERCONDUCTING STRUCTURE HAVING LINKED BAND-SEGMENTS WHICH ARE EACH OVERLAPPED BY DIRECTLY SEQUENTIAL ADDITIONAL BAND-SEGMENTS

(71) Applicant: Bruker HTS GmbH, Hanau (DE)

(72) Inventors: Klaus Schlenga, Linkenheim-Hochstetten (DE); Alexander Usoskin, Hanau (DE)

(73) Assignee: Bruker HTS GmbH, Hanau (DE)

( * ) Notice: Subject to any disclaimer, the term of this patent is extended or adjusted under 35 U.S.C. 154(b) by 0 days.

(21) Appl. No.: 14/047,029

(22) Filed: Oct. 7, 2013

(65) Prior Publication Data
US 2014/0100119 A1    Apr. 10, 2014

(30) Foreign Application Priority Data
Oct. 5, 2012    (DE) .......................... 10 2012 218 251

(51) Int. Cl.
| | |
|---|---|
| H01B 12/00 | (2006.01) |
| H01L 39/02 | (2006.01) |
| H01L 41/06 | (2006.01) |
| H01L 39/14 | (2006.01) |
| H01L 39/24 | (2006.01) |

(52) U.S. Cl.
CPC ............. *H01L 39/02* (2013.01); *H01L 41/06* (2013.01); *H01L 39/143* (2013.01); *H01L 39/248* (2013.01)

(58) Field of Classification Search
CPC ....................................... H01L 39/02
USPC .......................... 505/230, 925, 926
IPC ........................................... H01L 39/02
See application file for complete search history.

(56) References Cited

U.S. PATENT DOCUMENTS

| | | | | |
|---|---|---|---|---|
| 5,358,929 | A * | 10/1994 | Fujikami et al. | 505/100 |
| 6,121,205 | A | 9/2000 | Murakami et al. | |
| 6,828,507 | B1 | 12/2004 | Fritzemeier et al. | |
| 2003/0213611 | A1 | 11/2003 | Morita | |
| 2005/0173679 | A1 | 8/2005 | Mannhart et al. | |
| 2011/0294670 | A1* | 12/2011 | Mumford et al. | 505/237 |
| 2012/0065074 | A1* | 3/2012 | Xie et al. | 505/234 |

FOREIGN PATENT DOCUMENTS

| | | |
|---|---|---|
| EP | 0 545 608 | 6/1993 |
| EP | 1 198 846 | 4/2002 |
| EP | 1 479 111 | 11/2004 |

* cited by examiner

*Primary Examiner* — Paul Wartalowicz
(74) *Attorney, Agent, or Firm* — Paul Vincent

(57) ABSTRACT

A superconducting structure (1) has a plurality of linked band-segments (2), with each linked band-segment (2) having a substrate (3) and a superconducting layer deposited onto it (4). The linked band-segments (2) are joined to one another by superconducting layers (4) that face each other. Each linked band-segment (2) is joined to two additional band-segments (7a, 7b) in such a way that the superconducting layers (4) of the two additional band-segments (7a, 7b) and of the linked band-segment (2) face each other. The additional band-segments (7a, 7b) together substantially overlap the total length (L) of the linked band-segment (2). This provides for a superconducting structure, which exhibits high superconductivity and which is very suitable for long distances.

15 Claims, 4 Drawing Sheets

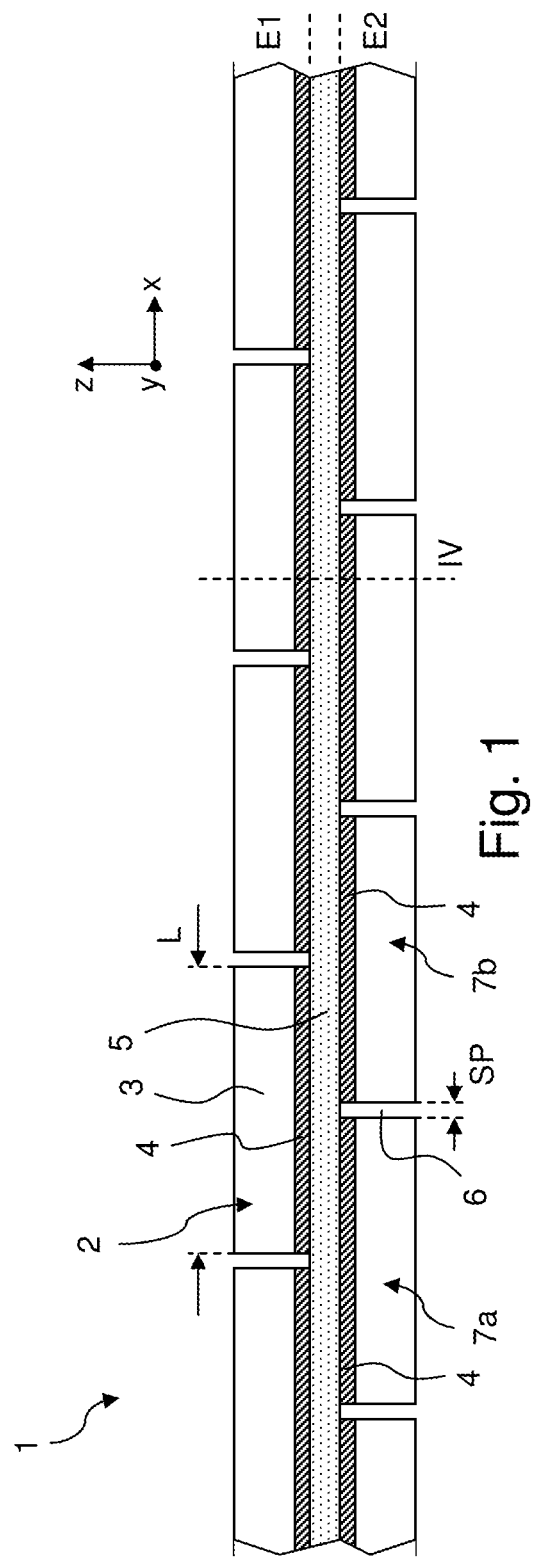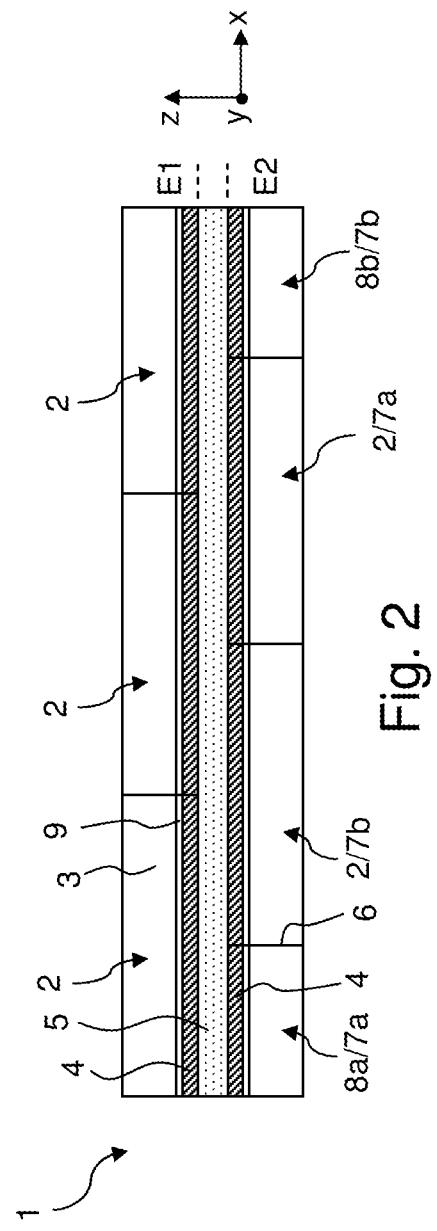

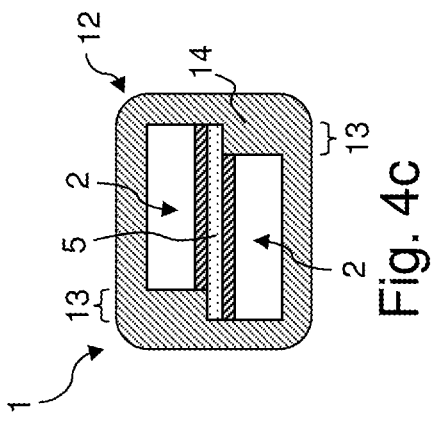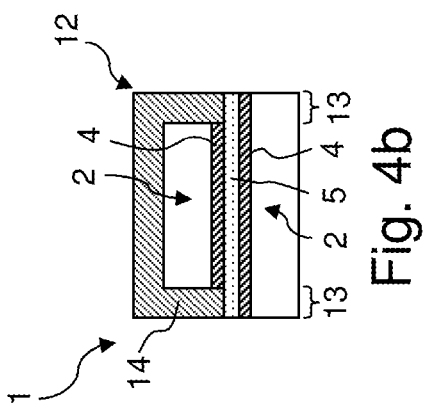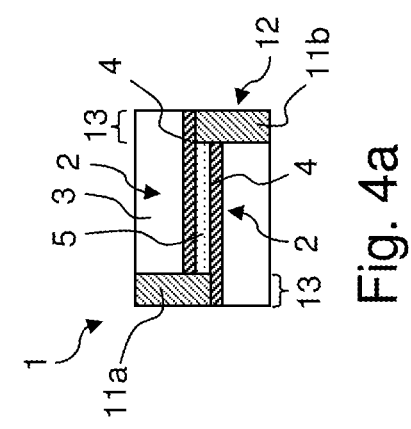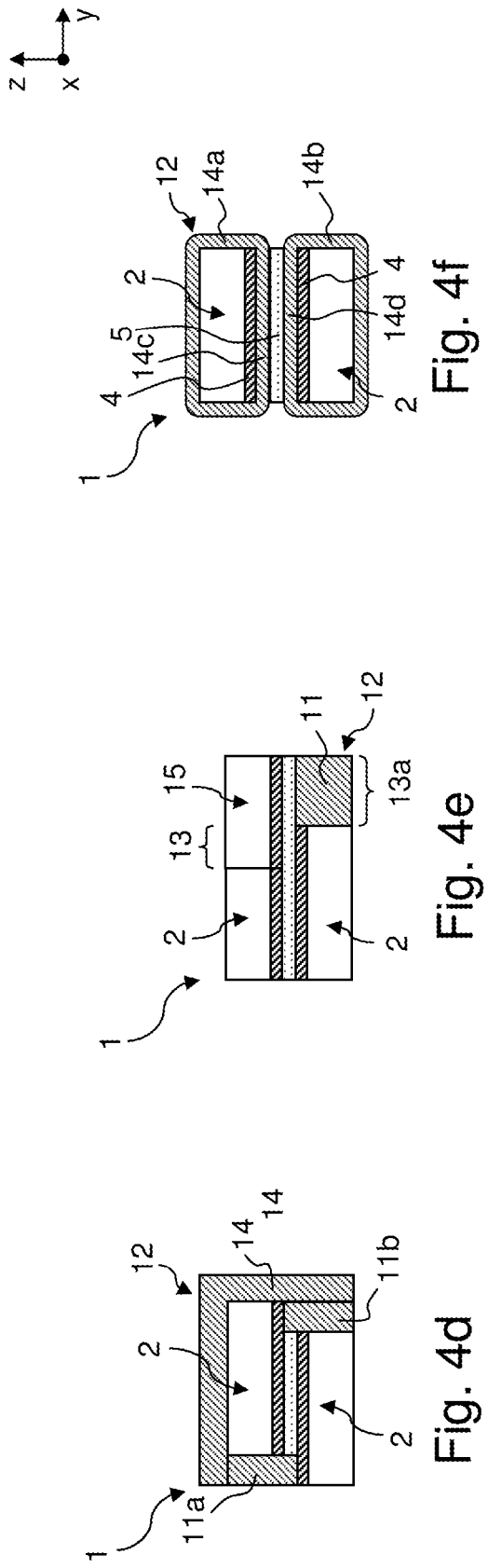

SUPERCONDUCTING STRUCTURE HAVING LINKED BAND-SEGMENTS WHICH ARE EACH OVERLAPPED BY DIRECTLY SEQUENTIAL ADDITIONAL BAND-SEGMENTS

This application claims Paris convention priority of DE 10 2012 218 251.0 filed on Oct. 5, 2012, the entire disclosure of which is hereby incorporated by reference.

BACKGROUND OF THE INVENTION

The invention relates to a superconducting structure, comprising a plurality of band-segments of band-shaped superconductors, wherein each band-segment has a substrate and a superconducting layer deposited onto it, and wherein the band-segments are joined to one another by superconducting layers that face each other.

US 2005/0173679 A1, for example, discloses such a superconducting structure.

Superconductors can carry electrical currents practically without any ohmic losses. They are especially deployed where high electrical currents are required, for example, in magnet coils.

Superconductors can only conduct electrical current without losses below a critical temperature (also called transition temperature). Above this temperature, the superconductor enters a normally conducting state.

Metal superconducting materials, such as NbTi, which can be processed as wires, have a relatively low critical temperature (for NbTi, for example, it is about 9K), making their use quite expensive, especially with respect to the necessary cooling. Moreover, metal superconductors have relatively low critical magnetic fields, above which they lose their superconductive properties.

High-temperature superconductors (HTSL), such as yttrium barium copper oxide (YBCO), have significantly higher critical temperatures, YBCO for example, about 90K, but are difficult to process due to their ceramic properties. If they are used at temperatures significantly below their critical temperature, HTSLs can conduct comparatively large currents, i.e. they have a high critical current density. With their comparatively high critical magnetic field strengths, these materials are also suitable for low operating temperatures in strong magnetic fields.

For technical applications, HTSLs are usually deposited as a thin layer onto band-shaped, usually metal substrates, wherein, as a rule, one or more buffer layers are interposed between the substrate and the superconducting layer, and one or more final metal layers are deposited on top of the superconducting layer. This type of construction is also termed a band-shaped superconductor and has commonly become known as a "coated conductor" in English.

However, depositing superconducting layers of good quality is relatively difficult. As a rule, substrate surfaces with a special texture are required, which can only be provided over limited lengths. Currently, good-quality band-segments of band-shaped superconductors are limited to a maximum range of approx. 100 to 200 m.

EP 0 545 608 A2 proposes joining conductor segments, which can only be manufactured in good quality in limited lengths, in order to enable current to be transported over longer distances, for instance, several kilometers.

US 2005/0173679 A1 discloses the joining of two band-segments of band-shaped superconductors, wherein the superconducting layers on the respective substrates face each other. The superconducting layers are to be in superconducting contact and the proximity of the two polycrystalline superconducting layers is intended to increase the effective grain boundary surface and thus improve the critical current.

U.S. Pat. No. 6,828,507 B1 also discloses the joining together of two band-segments of band-shaped superconductors, wherein the superconducting layers on the respective substrates face each other. The superconducting layers are joined by means of one or more normally conducting intermediate layers (for instance, covering layers of the individual band-segments).

The object of the invention is to provide a superconducting structure, which exhibits a high current-carrying capacity and which is also suitable for long distances.

SUMMARY OF THE INVENTION

This object is achieved with a superconducting structure of the type mentioned in the introduction, characterized in that a plurality of the band-segments are each constituted as a linked band-segment, wherein each linked band-segment is joined to two additional band-segments in such a way that the superconducting layers of the two additional band-segments and of the linked band-segment face each other, and that the additional band-segments together substantially overlap the total length of the linked band-segment.

The inventive superconducting structure exhibits a particularly high current-carrying capacity. Electrical current can cross between opposite band-segments. If the critical current density is inhomogeneous (for instance, due to normally conducting defect regions in a superconducting layer) in any one of the band-segments, the latter are bridged by their opposite band-segment and vice versa, so that such inhomogeneities do not cause any noticeably diminished current-carrying capacity of the superconducting structure overall.

Furthermore, the contact surfaces between opposite band-segments are very large: according to the invention, practically the entire length of a linked band-segment is used for transverse current crossing, which makes the contact resistance very small. In particular, it is possible to provide one or more layers of normally conducting material between opposite superconducting layers, without the ohmic resistance noticeably increasing. Nonetheless, these normally conducting layers should be made of materials exhibiting good electrical conductivity (for example, noble metals or copper or alloys thereof), and the thickness of the layers should be relatively small. These intermediate layers can simplify the manufacturing process of the superconducting structure and assist as heat conductors and parallel current paths to the superconducting layers to stabilize superconductivity and provide quench protection.

According to the invention, it is possible to keep ohmic cable resistance to negligible levels even if a large number of band-segments are sequentially linked. This also makes the invention very suitable for transmitting current over long distances, for example, in the kilometer range.

The additional band-segments, with which a linked band-segment is joined according to the invention, can also be linked band-segments; in this way practically any lengths can be constructed with the inventive superconducting structure.

According to the invention, the joining of two band-segments to mutually facing (opposite) superconducting layers results in superconducting or quasi superconducting electrical contact, so that, at least along the overlap, a negligible overall ohmic resistance occurs.

In a preferred embodiment of the inventive superconducting structure, the superconducting structure comprises at least N sequential, linked band-segments, where $N \geq 5$, preferably N≥20, in such a way that at least one of the additional band-segments associated with each one of the sequential, linked band-segments is itself a sequential, linked band-segment. In this way, the superconducting structure and its advantages can be used over any distance, in particular, over long distances. For all the inner band-segments (inner with respect to the longitudinal direction) of the sequential, linked band-segments, each of the two additional band-segments are linked band-segments and, for the two outer band-segments of the sequential, linked band-segments, only one of the additional band-segments is a linked band-segment. The superconducting structure of this variant always comprises band-segments in two planes (upper and lower plane). The linked band-segments in the upper plane are disposed sequentially with their superconducting layers oriented downward, and the linked band-segments in the lower plane are also disposed sequentially but with their superconducting layers oriented upward.

In a preferred variant of this embodiment, the superconducting structure is constituted periodically along the sequential, linked band-segments in the longitudinal direction of the band segments. This makes the structure especially simple; in particular, band-segments of the same length can be integrated.

An embodiment is also preferred in which the superconducting structure has two peripheral band-segments, wherein one peripheral band-segment is joined to a linked band-segment in such a way that the superconducting layers of the peripheral band-segment and of the linked band-segment face each other, and the linked band-segment substantially overlaps the total length of the peripheral band-segment. The superconducting structure can be terminated at both ends (front and rear end) with the peripheral band-segments. The peripheral band-segments can be disposed in the same plane or in different planes. Typically, the linked band-segment overlaps at least 95%, preferably at least 99%, or also 100% of the length of the peripheral band-segment.

In an especially preferred embodiment of the inventive superconducting structure, the two additional band-segments together overlap at least 95%, preferably at least 99% of the total length of a linked band-segment. In this way, a very large contact surface between the overlapping band-segments and a correspondingly small electrical resistance can be achieved. Any remaining (non-overlapping) length of the linked band-segment typically corresponds to a gap between the additional band-segments, and/or to entry or exit points for the electrical current (which are then usually at the ends of the superconducting structure).

An embodiment is also preferred, in which the linked band-segments each have a length of at least 100 m, preferably at least 200 m. On the one hand, this also ensures that the overlapping lengths with the additional band-segments are also large (usually approximately half of the length of the linked band-segment for each additional band-segment), on the other hand, with band-segment lengths of this size it is possible to efficiently constitute a large total length of the superconducting structure.

Also preferred is an embodiment, in which the superconducting structure has a total length of at least 1000 m, preferably at least 2000 m. The inventive superconducting structure can provide such large total lengths without any problem; the advantages of the invention are then especially apparent.

In an advantageous embodiment, a gap between two additional band-segments, which are joined to the same linked band-segment, has a gap width in the longitudinal direction of the band-segments of 5 mm or less, preferably 2 mm or less, in particular, wherein the gap is closed with abutting additional band-segments. Due to the small or even negligible gap width, it is very unlikely that an inhomogeneity of the critical current density in the linked band-segment will happen to be located beneath the gap.

An embodiment is also preferred, in which the gap between two additional band-segments that are joined to the same linked band-segment are disposed approximately in the center of the length of this linked band-segment. By disposing the gap in the center, the contact surfaces with the additional band-segments have approximately the same partial length available to them, wherein a one-sided increase of the contact resistance with one of the additional band-segments is avoided. Typically, the gap position deviates by no more than 10%, preferably by no more than 5%, from the center of the linked band-segment, with reference to the length of the linked band-segment.

In an advantageous embodiment of the inventive superconducting structure, the mutually opposite ends of two additional band-segments, which are joined to the same linked band-segment, each taper toward the other additional band-segment, in particular, so that a gap between these two additional band-segments, at least in sections, extends at an angle of between 5° and 30° with respect to the longitudinal direction of the band-segments. In this variant, the gap between the additional band-segments, at least in sections, extends obliquely (and in particular, not perpendicularly) with respect to the longitudinal direction of the linked band-segment. The gap extends a considerable distance (in the longitudinal direction of the linked band-segment), but at no point extends over the full width of the superconducting structure. In this way, inhomogeneities of the critical current, which do not usually extend over the full width of a superconducting layer (cf. typical bandwidths of between 2 mm and 6 cm) can regularly easily be bridged, even if they are located in the vicinity of the gap.

An embodiment is also preferred, in which mutually facing superconducting layers of linked band-segments
  are contiguous,
  or are joined to one another by one or more layers of noble metal, in particular, layers containing silver, and/or one or more layers containing copper, in particular layers consisting of copper. If they are contiguous, very good (even superconducting) contact can always be established between the superconducting layers; however, the joining technology is difficult to master. If they are joined by means of a normally conducting layer (or a plurality of such layers), production of the superconducting structure is simpler, and the layers can be used to perform a function (for example, stabilization or quench protection). Due to the large contact surfaces, only a negligible ohmic resistance occurs through the normally conducting layer (or through a plurality of such layers) if suitable material (with sufficiently high electrical conductivity) and a suitable layer thickness (not too thick) are chosen.

An embodiment is also advantageous, in which the band-segments of the superconducting structure are provided on the outside with a shunt structure, in particular, partially or completely enveloped in a shunt layer. In this way, a normally conducting current path is provided that extends parallel with the superconducting layers which, in the case of a sudden collapse of the superconductivity ("quench"), can take over the previously superconductively carried electrical current. In this way, overheating ("melting through") of the superconducting layers can be avoided. In particular, the shunt structure can be made of copper.

In a preferred further embodiment, two band-segments, which are joined by mutually facing superconducting layers, do not overlap, in one or more overlap sections, transversely with respect to the longitudinal direction of the band-segments, and that the shunt structure contacts the associated band-segment in at least one said overlap section. In this way, conduction of electrical current out of the superconducting layers of the band-segments is particularly easy if a quench occurs. Two overlap sections can occur as the result of the offset of two equally wide band-segments that extend transversely with respect to the longitudinal direction of the band-segments; one or two overlap sections can result by using band-segments of different widths.

An embodiment is especially preferred in which the superconducting layer contains a high-temperature superconducting material, in particular, YBCO or BSCCO. HTSL material allows operation at high temperatures (for example, with $LN_2$ cooling), which saves maintenance costs, or a particularly high current-carrying capacity can be achieved (at lower temperatures, particularly with LHe cooling). Within the scope of the invention, HTSL materials are considered to be any materials with a critical temperature above 40K. BSCCO materials can comprise $Bi_2Sr_2CaCu_2O_{8+x}$ and/or $Bi_2Sr_2Ca_2Cu_3O_{10+x}$.

Also advantageous is an embodiment, in which a buffer layer, in particular, containing CeO2, is disposed between the substrate and the superconducting layer. In this way, the quality of the superconducting layer can be improved. It is also possible to use multiple buffer layers.

The scope of this invention also includes a method for transporting electrical current along a superconducting structure, comprising a plurality of band-segments of band-shaped superconductors, in particular, along an inventive superconducting structure described above, wherein each band-segment comprises a substrate and a superconducting layer deposited onto it,
and wherein the current crosses between the band-segments, for which a transverse current flows,
which is characterized in that transverse current essentially flows along the entire length of the superconducting structure, with the exception of local regions
of gaps between sequential band-segments that are in the same plane of the superconducting structure and
of positions of a local inhomogeneity of the critical current.
By providing transverse flow of current along what is essentially the entire length of the superconducting structure, contact resistance between the involved band-segments is minimized. It is important to observe that, according to the inventive method, in many regions of the surface of a superconducting layer, a net transverse current of "zero" certainly can flow, which does not mean, however, that no transverse current flow occurs here, only that the magnitude of the transverse current flowing in one direction is equal to that flowing in the opposite direction; in such regions of the surface, a transverse current indeed flows for the purpose of the inventive method. At gaps and regions of inhomogeneity (for example, normally conducting defect regions in the superconducting layers of the band-segments), the transported electrical current is redirected via a bridging band-segment due to suitable transverse current flows in front of and behind the gap or the inhomogeneity, so that high current-carrying capacities of the superconducting structure can be achieved according to the inventive method. It is important to note that gaps are typically very much smaller than the length of a band-segment, with gap widths of typically 5 mm or less, preferably 2 mm or less, and typical lengths of a band-segment bridging the gap of 100 m or more, preferably 200 m or more.

In a preferred variant of the inventive method, more than 99%, preferably more than 99.999% of the electrical current transported along the superconducting structure crosses between band-segments, which are joined to each other by mutually facing superconducting layers. According to the variant, most of the current by far is transported in the superconducting layers, which participate in the crossing of the current between different band-segments, whereby the advantages of the invention are particularly apparent.

Equally preferred is a variant, in which, on one linked band-segment that joins two sequential, additional band-segments in one plane across a gap located between these band-segments, the net transverse current that flows to and from the additional band-segments has a local maximum in the region of the first end of the linked band-segment, a further local maximum in the region just in front of a gap of the two additional band-segments, a local minimum in the region just behind the gap of the two additional band-segments, and finally a further local minimum in the region of the second end of the linked band-segment, or vice versa. With this transverse current profile, the transported current can be efficiently redirected in front of a gap. In the case of oblique gaps, the extrema in the vicinity of a gap are usually less pronounced.

Further advantages result from the description and the drawing. Moreover, the features stated above and further below can be used singly or together in any combination. The embodiments shown and described are not intended to be an exhaustive list, rather are examples to explain the invention.

The invention is shown in the drawing and is explained in more detail using the example of the embodiments. The figures show:

BRIEF DESCRIPTION OF THE DRAWING

FIG. 1 a schematic longitudinal section through a periodic part of an inventive superconducting structure;

FIG. 2 a schematic longitudinal section through an inventive superconducting structure with five linked band-segments and two peripheral band-segments;

FIG. 4*a*-4*f* schematic cross-sections through different embodiments of an inventive superconducting structure.

DESCRIPTION OF THE PREFERRED EMBODIMENT

Figure 3B:
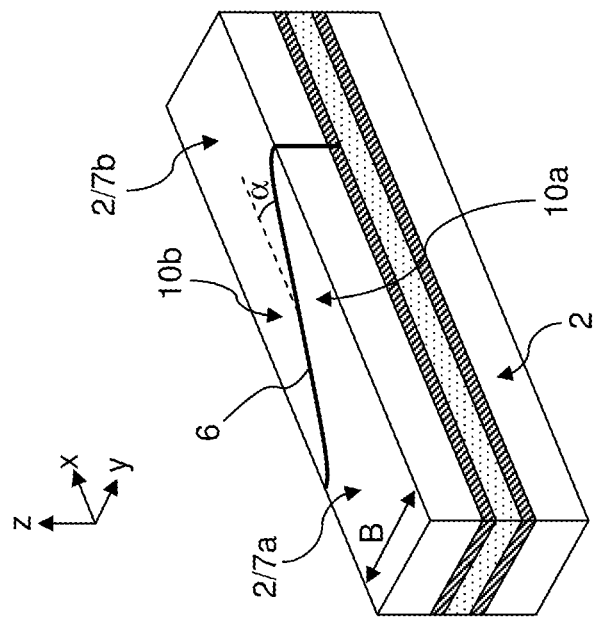
FIG. 3*b* a schematic oblique view onto part of an inventive superconducting structure in the region of a gap that extends obliquely with respect to the longitudinal direction.

FIG. 1 shows a cutout view in a schematic longitudinal section of a portion of inventive superconducting structure 1. The superconducting structure 1 has a plurality of band-segments of band-shaped superconductors, wherein the cutout view of the figure only comprises so-called linked band-segments 2. The sectional view shows a total of eleven sequential, linked band-segments 2 shown either partially or in their entirety (for the purposes of simplification, only one of the band-segments is marked with reference number 2 in the figure).

Each band-segment 2 has a substrate 3 (for instance, made of sheet steel) and a superconducting layer 4 deposited on the substrate 3. The band-segments 2 are disposed in two planes E1, E2; the band-segments 2 in the upper plane E1 are oriented with their superconducting layers 4 facing downward (toward the lower plane E2), and the band-segments 2 in the lower plane E2 are oriented with their superconducting layers 4 facing upward (toward the upper plane E1). A layer 5 of solder, which here consists of an alloy containing silver, is disposed between the band-segments 2 of the different planes E1, E2.

Between each of the adjacent band-segments 2 in the same plane E1, E2 in the depicted embodiment, there is a gap 6 with a gap width SP that is very much smaller than length L of the band-segments 2. In the sectional view shown, the superconducting structure 1 has a periodic structure in the longitudinal direction (x-direction) (in both planes E1, E2 and in total); in particular, all linked band-segments 2 here have the same length L and the gaps 6 have the same gap width SP.

It is important to observe that the dimensions in FIG. 1 (and in the subsequent figures) are not to scale and many of the structural elements are shown enlarged to make it easier to distinguish them. In the longitudinal direction x of the superconducting structure 1, the band-segments 2 typically have a length L of ten meters or more; gap widths SP (in the x direction) are typically 5 mm or less. The width of the band-segments 2 perpendicular to the drawing plane of FIG. 1 (y direction) are typically between 2 mm and 6 mm, and the height of the band-segments 2 in the z direction is typically in the range 200 μm or less, usually approx. 100 μm or less. The thickness of a superconducting layer 4 (in the z direction) is usually several μm, and the thickness of a typical solder layer 5 is usually in the 100 μm range or less, often 25 μm or less.

The superconducting structure 1 is used to transport an electrical current in its longitudinal direction x. For that reason, the band-segments 2 are inventively constituted as linked band-segments 2. Each linked band-segment 2 overlaps in the x direction with two additional band-segments 7a, 7b (which themselves are linked band-segments here). In this case, the length L of the linked band-segment 2 is more of less fully overlapped by the two band-segments 7a, 7b combined; only in the region of gap 6 between the additional band-segments 7a, 7b is there no overlap in the embodiment shown. The gap 6 is centrally positioned with respect to the linked band-segment 2, so that the lengths overlapping with the band-segments 7a, 7b are each approximately L/2.

An electric current to be transported in the longitudinal direction of superconducting structure 1 (x direction) in the additional band-segment 7a (and/or its superconducting layer 4) can cross into the linked band-segment 2 over a very large surface (transverse current flow in the z direction), before the gap 6 blocks further current flow in the longitudinal direction. The ohmic resistance at this crossover point is correspondingly low. In the linked band-segment 2, the current flow can then cross the gap 6. The current can then similarly cross into the additional band-segment 7b, in order to bridge the next gap, and so forth.

FIG. 2 also shows an inventive superconducting structure 1 in a longitudinal section with exactly five linked band-segments 2 and two peripheral band-segments 8a, 8b; the superconducting structure 1 extends in the x direction. The gaps 6 between the adjacent band-segments 2, 8a, 8b within the two planes E1, E2 have a negligible gap width (in the x direction) in this embodiment.

The superconducting layers 4 of the left and right outer linked band-segments in the upper plane E1 each face toward one of the peripheral band-segments 8a, 8b and toward a linked band-segment 2 as additional band-segments 7a, 7b, or they are joined thereto by means of the layer 5 of solder. The peripheral band-segments 8a, 8b are here fully overlapped by their respective opposite outer linked band-segment 2 in the x direction.

The embodiment shown also has a buffer layer 9 of the band-segments 2, 8a, 8b, which, for example, contains $CeO_2$ and is disposed between the substrate 3 and the superconducting layer 4.

Figure 3A:
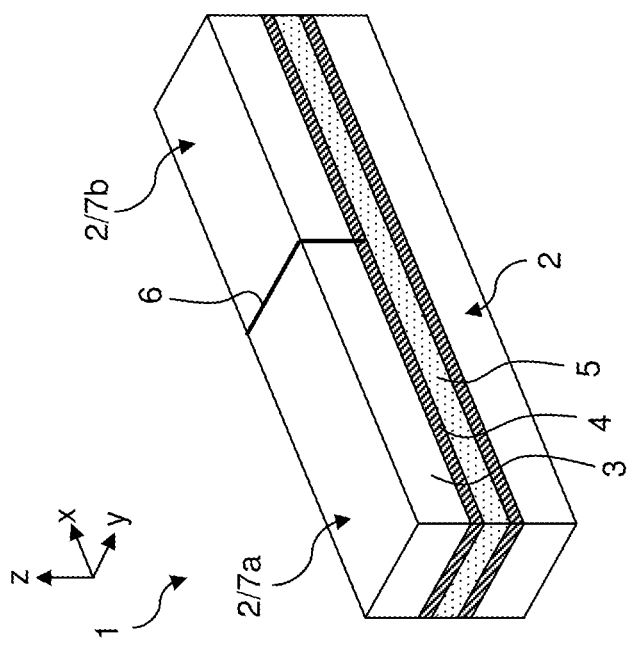
FIG. 3*a* a schematic oblique view onto part of an inventive superconducting structure in the region of a gap that extends transversely with respect to the longitudinal direction.

FIG. 3a shows a schematic oblique view of a sectional view of an inventive superconducting structure 1, for example, of a superconducting structure as shown in FIG. 1, in the region of a gap 6 between two adjacent, linked band-segments 2 in the upper plane of the superconducting structure 1; these two band-segments represent additional band-segments 7a, 7b of band-segment 2 in the lower plane. In the embodiment shown, the gap 6 extends transversely (perpendicularly) with respect to the longitudinal direction x of the superconducting structure 1; this gap geometry is particularly easy to produce.

However, it is also possible to constitute the gap 6 obliquely with respect to the longitudinal direction (x direction), as is shown in the superconducting structure 1 of FIG. 3b. The ends 10a, 10b of the band-segments 2 and 7a, 7b respectively in the upper plane of the superconducting structure 1 here each taper toward the other band-segment 2 and/or 7b, 7a; the ends 10a, 10b expand more or less to the full width B of the two band-segments 2 and 7a, 7b respectively. The remaining gap 6 largely extends at an angle α of approx. 15° with respect to the longitudinal direction x.

According to the invention, a gap width SP is always measured in the longitudinal direction x, even if the gap 6 extends obliquely with respect to the longitudinal direction x. If the gap width along gap 6 varies, the gap width SP of the gap overall is always determined by the largest gap width occurring along the gap 6.

FIGS. 4a to 4f show cross sections (cf. plane IV in FIG. 1) of various embodiments of inventive superconducting structures 1, wherein the cross section is selected at a position away from the gaps.

As can be seen in FIG. 4a, the opposite, here equally wide, band-segments 2 of an inventive superconducting structure 1, can be disposed offset with respect to each other (in the y direction) in such a way that two overlapping sections 13 remain transverse with respect to the longitudinal direction x. The latter are contacted with two shunt elements 11a, 11b, preferably made of copper, so that two normally conducting current paths are established parallel to the superconducting layers 4, to constitute a shunt structure 12. A solder containing silver is provided for a good electrical contact between the superconducting layers 4 (however, here not below the shunt elements 11a, 11b).

In the embodiment of the superconducting structure 1 shown in FIG. 4b, two band-segments 2 of different widths are integrated. The thinner, upper band-segment 2 is placed in the center of the lower, wider band-segment 2 and is enveloped in a shunt layer 14, which also covers the overlap sections 13 of the lower band-segment 13. In the embodiment shown, the shunt layer 14 (which is preferably made of copper) contacts with a solder layer 5, whereby good electrical contact with both superconducting layers 4 is assured. In this way, the shunt layer 14 can be deployed as the shunt structure 12 for both band-segments 2.

In the embodiment of the superconducting structure of FIG. 4c, the two opposite band-segments 2, which are however laterally displaced with respect to each other are fully enveloped in a shunt layer 14, which correspondingly also contacts with the overlap section 13 (here, by means of the solder layer 5). The shunt layer 14 here not only acts as the shunt structure 12 but also as a mechanical bracket for both band-segments 2.

FIG. 4d shows a variant of the embodiment of FIG. 4a, wherein an additional shunt layer 14, which is L-shaped, surrounds the two shunt elements 11a, 11b and the upper band-segment 2. In this way, the cross-section surface of the entire shunt structure 12 can be increased.

It is also possible to only partially overlap a band-segment 2 disposed below in FIG. 4e with an upper band-segment 2 laterally in the y direction so that an overlap section 13 remains, and to contact this overlap section 13 with an auxiliary band-segment 15. The auxiliary band-segment 15 can but does not have to be a linked band-segment of the superconducting structure 1. The auxiliary band-segment 15 forms an auxiliary overlap section 13a, which can be contacted with a shunt element 11, wherein practically any width (in the y direction) of the auxiliary overlap section 13a can be defined by the width of the auxiliary band-segment 15. This can be used to set the power of the shunt configuration 12.

Moreover it is possible to constitute a shunt configuration 12 with two shunt layers 14a, 14b (here made of copper), which each separately envelops one of the two band-segments 2, and to join the two shunt layers 14a, 14b by means of a solder layer 5, cf. FIG. 4f. As a result, two copper layers 14c, 14d, and a solder layer 5, here made of silver, effectively lie between the facing superconducting layers 4 of the two band-segments 2.

Figure 5:
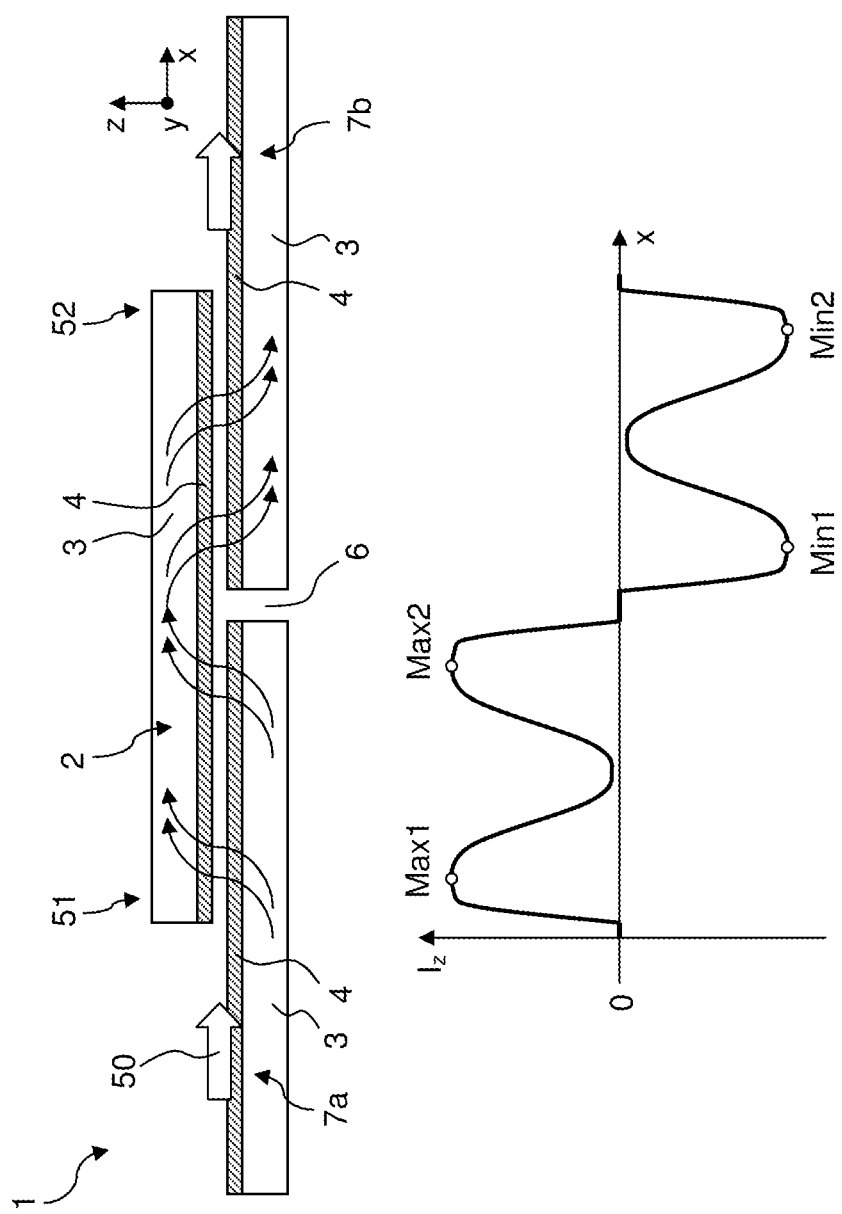
FIG. 5 a diagram schematically illustrating the transverse current through a linked band-segment or an inventive superconducting structure as a function of the location along the longitudinal direction of the superconducting structure.

FIG. 5 illustrates the flow of electrical current 50 transported in an inventive superconducting structure 1 in the longitudinal direction x. The superconducting structure 1 comprises at least one linked band-segment 2 and two additional band-segments 7a, 7b joined to the latter, which overall overlap the band-segment 2 along its entire length in the x direction up to a gap 6 extending in the y direction. In the diagram, the transverse current flow $I_z$, that is, the current flowing in the z direction perpendicularly into the superconducting layer 4 of the band-segment 2 (or out of it if the sign is negative), is shown as a function of the x position. For the sake of clarity, the band-segments 2, 7a, 7b in the upper part of the figure are depicted more spread out.

The transverse current $I_z$ initially has a maximum Max1 in the vicinity of the left end 51, as shown in FIG. 5, of the band-segment 2 because in this region the current flowing from the left through the additional band-segment 7a can for the first time reach the band-segment 2 and utilize it. Finally, in front of gap 6 all (remaining) current from the additional band-segment 7a must cross into the band-segment 2, which results in a further maximum Max2. It is important to note that Max1 and Max2 are typically equally large. No transverse current flow is possible directly above the gap 6 between the two additional band-segments 7a, 7b (which have the same position with respect to z, i.e. are in the same plane). Beyond the gap 6, current can, for the first time, flow into the additional band-segment 7b, which results in a first minimum Min1 of the transverse current $I_z$. Just in front of the right end 52 of the band-segment 2, all the (remaining) current must finally cross into the additional band-segment 7b, which can be recognized by the additional minimum Min2.

Similarly to a gap 6, any inhomogeneity of the critical current (for example, a normally conducting defect region in a superconducting layer 4) can be bypassed by the current 50.

An inventive superconducting structure can, in particular, be used in superconducting cables or in superconducting magnet coils.

We claim:

1. A superconducting structure, comprising:
a plurality of linked band-segments, said plurality of linked band-segments having a total length extending in an x-direction, each linked band-segment having a substrate and a first superconducting layer deposited onto said substrate, wherein linked band-segments which are adjacent to each other in said x-direction are each separated from another by a linked band-segment gap having a linked band-segment gap size in said x-direction; and
a plurality of additional band-segments extending in said x-direction, wherein additional band-segments which are adjacent to each other in said x-direction are each separated from another by an additional band-segment gap having an additional band-segment gap size in said x-direction which is substantially equal to said linked band-segment gap size, each additional band segment having a second superconducting layer, wherein each of said linked band-segments is joined to two said additional band-segments in such a way that said second superconducting layers of said two additional band-segments and said first superconducting layer of said linked band-segment face each other, wherein said plurality of additional band-segments substantially overlap said total length of said plurality of linked band-segments but are displaced in said x-direction relative to said linked band-segments such that each linked band-segment gap is disposed proximate to a central region of an adjacent additional band-segment and each additional band-segment gap is disposed proximate to a central region of an adjacent linked band-segment, said linked band-segments and said additional band-segments thereby being disposed, structured and dimensioned such that electrical current which is initially transported in said x-direction within a first additional band-segment is subjected to a transverse current flow in a z-direction, perpendicular to said x-direction, and into a first linked band-segment, said transverse current flow having a first maximum proximate to and downstream of a first linked band-segment gap that neighbors and is upstream of said first linked band-segment and a second maximum proximate to and upstream of a first additional band-segment gap that neighbors and is downstream of said first additional band-segment, said transverse current flow having a first minimum proximate to and downstream of said first additional band-segment gap and a second minimum proximate to and upstream of a second linked band-segment gap that neighbors and is downstream of said first linked band-segment.

2. The superconducting structure of claim 1, wherein the superconducting structure comprises at least N sequential, linked band-segments, where N≥5, wherein at least one of said additional band-segments is joined to two said linked band-segments.

3. The superconducting structure of claim 2, wherein the superconducting structure is constituted periodically along said sequential, linked band-segments in a longitudinal direction of said linked band-segments.

4. The superconducting structure of claim 1, wherein band-segments of the superconducting structure are provided on an outside with a shunt structure or are partially or completely enveloped in a shunt layer.

5. The superconducting structure of claim 4, wherein two band-segments which are joined by mutually facing superconducting layers, do not overlap, in one or more overlap sections, transversely with respect to a longitudinal direction of the band-segments and that said shunt structure contacts an associated band-segment, in at least one said overlap section.

6. The superconducting structure of claim 1, wherein the superconducting structure further comprises two peripheral band-segments, wherein each peripheral band-segment has a third superconducting layer, wherein each said peripheral band-segment is joined to said linked band-segment in such a way that said third superconducting layer of said peripheral band-segment faces said first superconducting layers of said linked band-segment, wherein said linked band-segment substantially overlaps a total length of said peripheral band-segment.

7. The superconducting structure of claim 6, wherein said two additional band-segments overlap at least 95% of said total length of said linked band-segments.

8. The superconducting structure of claim 1, wherein said linked band-segments each have a length of at least 100 m.

9. The superconducting structure of claim 1, wherein the superconducting structure has a total length of at least 1000 m.

10. The superconducting structure of claim 1, wherein a gap between two said additional band-segments, which are joined to a same said linked band-segment, has a gap width in a longitudinal direction of said additional band-segments of 5 mm or less.

11. The superconducting structure of claim 1, wherein a gap between two said additional band-segments, which are joined to a same said linked band-segment is disposed approximately centrally with respect to a length of that linked band-segment.

12. The superconducting structure of claim 1, wherein mutually facing ends of two said additional band segments, which are joined to a same said linked band-segment, taper toward each other or taper to form a gap such that those two additional band segments extend at an angle of between 5° and 30° with respect to a longitudinal direction.

13. The superconducting structure of claim 1, wherein mutually facing superconducting layers of joined band-segments are contiguous or are joined to one another by one or more layers of noble metal or by layers containing silver and/or one or more layers containing copper or layers consisting of copper.

14. The superconducting structure of claim 1, wherein at least one of said first and said second superconducting layers contains a high-temperature superconducting material, YBCO or BSCCO.

15. The superconducting structure of claim 1, further comprising a buffer layer or a buffer layer containing $CeO_2$, disposed between said substrate and at least one of said first and said second superconducting layers.

* * * * *